United States Patent
Pennock

(10) Patent No.: US 8,081,770 B2
(45) Date of Patent: Dec. 20, 2011

(54) PATTERN DETECTION CIRCUITRY

(75) Inventor: John L. Pennock, Midlothian (GB)

(73) Assignee: Wolfson Microelectronics plc, Edinburgh (GB)

( * ) Notice: Subject to any disclaimer, the term of this patent is extended or adjusted under 35 U.S.C. 154(b) by 952 days.

(21) Appl. No.: 12/047,001

(22) Filed: Mar. 12, 2008

(65) Prior Publication Data

US 2008/0240462 A1   Oct. 2, 2008

(30) Foreign Application Priority Data

Mar. 30, 2007  (GB) .................... 0706330.8

(51) Int. Cl.
   *H03M 3/00*  (2006.01)
(52) U.S. Cl. ........................................ 381/86
(58) Field of Classification Search .......... 381/86, 381/107, 58, 98, 97, 101, 102, 57; 708/670; 704/200, 201, 211–230; 379/386, 388.04–388.07, 379/406.01–406.16
   See application file for complete search history.

(56) References Cited

U.S. PATENT DOCUMENTS

| | | | |
|---|---|---|---|
| 5,369,791 A * | 11/1994 | Asghar et al. | 455/222 |
| 5,889,483 A * | 3/1999 | Tagami et al. | 341/143 |
| 6,047,036 A | 4/2000 | Schnizlein | |

* cited by examiner

*Primary Examiner* — Dao H Nguyen
*Assistant Examiner* — Tram H Nguyen
(74) *Attorney, Agent, or Firm* — Dickstein Shapiro LLP

(57) ABSTRACT

A pattern detection circuit detects a pattern in a received bit stream, for example a repetitive 8-bit silence pattern in a stream of digital audio data. Summing circuitry forms during first alternate time periods a sum of a first sequence comprising a predetermined number of alternate bits in the bit stream; and forms during second alternate time periods an inverse of a sum of a second sequence comprising the predetermined number of alternate bits in the bit stream. It is then determined whether successive sums formed by the summing circuitry are equal.

29 Claims, 5 Drawing Sheets

PATTERN DETECTION CIRCUITRY

BACKGROUND OF THE INVENTION

1. Field of the Invention

This invention relates to pattern detection circuitry, in particular for use in an audio signal reproduction device, and to a method of operation of such pattern detection circuitry.

2. Description of the Related Art

It is known in audio reproduction devices to use sigma-delta modulation to encode data for storage or transmission over a transmission channel. For example, in the Direct Stream Digital (DSD) data format used for encoding data for storage on Super Audio Compact Discs (SACDs), a 1-bit sigma-delta modulator is used.

In this data format, periods of silence, for example between the tracks on a CD, are represented by a repetitive 8-bit pattern with equal numbers of ones and zeros. The playback system can then detect this pattern, and can disable or mute the output stage. However, if the pattern is not successfully detected, it will produce spectral tones with large amplitudes at frequencies of one eighth of the sampling frequency, and multiples thereof.

Although these frequencies are in the inaudible ultrasonic range, they can overload the amplifier or speakers in the playback system such that they may cause audible artefacts or may even cause damage to the amplifier or speakers.

SUMMARY OF THE INVENTION

According to a first aspect of the present invention, there is provided a pattern detection circuit, for detecting a pattern in a received bit stream, comprising:
  summing circuitry,
  for forming during first alternate time periods a sum of a first sequence comprising a predetermined number of alternate bits in the bit stream; and
  for forming during second alternate time periods an inverse of a sum of a second sequence comprising said predetermined number of alternate bits in the bit stream, the second alternate time periods being interleaved with the first alternate time periods, and the second sequence of alternate bits being interleaved with the first sequence of alternate bits; and
  comparison circuitry, for determining whether successive sums formed by the summing circuitry are equal.

According to a second aspect of the present invention, there is provided a method of detecting repetitive pattern in a received bit stream, the method comprising:
  forming during first alternate time periods a sum of a first sequence comprising a predetermined number of alternate bits in the bit stream; and
  forming during second alternate time periods an inverse of a sum of a second sequence comprising said predetermined number of alternate bits in the bit stream, the second alternate time periods being interleaved with the first alternate time periods, and the second sequence of alternate bits being interleaved with the first sequence of alternate bits; and
  determining whether the sum of the first sequence and the inverse of the sum of the second sequence sums are equal during a plurality of successive sample periods.

This has the advantage that it allows the detection of repeated patterns of known length, where the repeated pattern contains equal numbers of the two possible logic values, without also detecting other repeated patterns.

BRIEF DESCRIPTION OF THE DRAWINGS

For a better understanding of the present invention, and to show how it may be put into effect, reference will now be made, by way of example only, to the accompanying drawings, in which.

DETAILED DESCRIPTION OF THE PREFERRED EMBODIMENTS

Figure 1:
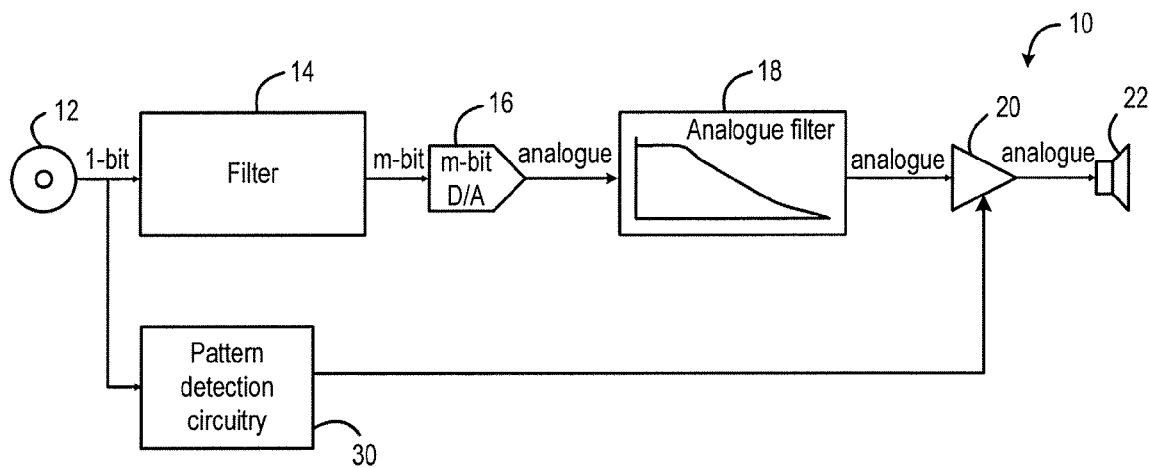
FIG. 1 is a block schematic diagram of an audio reproduction system, in accordance with an aspect of the present invention.

FIG. 1 is a block schematic diagram, illustrating an audio signal reproduction system 10. The system includes a signal reproduction device 12, for example for reading a stored signal from a storage medium. In one embodiment of the invention, the stored signal has been encoded on an optical disc using the Direct Stream Digital (DSD) data format and the signal reproduction device is a Super Audio Compact Disc (SACD) player. The signal reproduction device 12 thus generates a 1-bit data stream.

The 1-bit data stream is applied to digital filter circuitry 14, whose function, in general terms, is to remove as far as possible the unwanted ultrasonic components of the encoded signal.

The filtered multi-bit sigma-delta signal output from the filter 14 is applied to a multi-bit sigma-delta digital-analogue (D/A) converter 16, which reconstructs the original analogue signal waveform.

The D/A converter output signal is then applied to an analogue low pass filter 18 to further smooth the signal. The resulting signal is applied to an amplifier 20, which then drives the loudspeaker 22.

Although an illustrative audio signal reproduction system 10 is shown in FIG. 1, it will be appreciated that many variations are possible, and that the components of the system may be contained in a single unit or in multiple units, as appropriate.

As shown in FIG. 1, the reproduction system 10 also includes pattern detection circuitry 30, which receives the 1-bit data stream generated by the signal reproduction device 12. The function of the pattern detection circuitry 30 is to detect when the 1-bit data stream contains a repetitive 8-bit silence pattern. In response to such detection, appropriate action can be taken. For example, the amplifier 20 can be disabled.

In one embodiment of the invention, if the pattern detection circuitry 30 detects that the 1-bit data stream contains a repetitive 8-bit silence pattern, it generates an output that is supplied to the amplifier 20 to "mute" it, for example by disconnecting it from the preceding analog filter 18, and setting its output to a clean analog level, say ground, (or an equivalent mid-rail voltage for a single-supply system). In this state, the noise at the output would be only the thermal noise of the amplifier, with no contribution from any residual in-band quantisation noise or thermal noise from the filter etc. Alternatively, the output could be shorted to ground and the amplifier powered off, but this operation (and subsequent power-on) tends to be extended over a long time (>100 ms), so as to avoid audible thumps and clicks, and so would only be performed after a long idle time, rather than between every track of a CD. For example, this option may be suitable if the signal reproduction device 12 itself prepares to go into a standby mode after being inactive for several minutes.

In embodiments of the invention, the reproduction system may include at least one wireless link between different components. For example, the power amplifier 20 and loudspeaker 22 may be in a separate device from the signal reproduction device 12. For example, the amplifier 20 and loudspeaker 22 may be in a wireless headphone set or a local portable media player. In such a case, a signal indicating the detection of silence could be used to disable the power amplifier and/or other non-essential features of the device, in order to conserve energy, which is a particular advantage in the case of a battery-powered device.

Embodiments of the invention detect the presence of a repetitive 8-bit silence pattern containing equal numbers of positive and negative bit values, that is, containing equal numbers of bits representing the values +1 and −1, by forming a first value during first alternate time periods as the sum of four consecutive odd-numbered bits in said bit stream; and forming a second value during second alternate time periods as the inverse of the sum of four consecutive even-numbered bits in said bit stream; and then determining whether successive first and second values are equal. It will be appreciated that the designation of bits as "odd-numbered" or "even-numbered" is arbitrary, and serves only to distinguish the bits from each other.

That is, for a sequence of bit values b(i), at a sample position n, the sum d(n) of the four most recent odd-numbered bits, defined above as the first value, is given by:

$$d(n)=b(n)+b(n-2)+b(n-4)+b(n-6).$$

At the next sample position (n+1), the sum d(n+1) of the four most recent even-numbered bits is given by:

$$d(n+1)=b(n+1)+b(n-1)+b(n-3)+b(n-5),$$

and its inverse, defined above as the second value, is given by:

$$-d(n+1)=-[b(n+1)+b(n-1)+b(n-3)+b(n-5)].$$

Thus, if the first and second values are equal, that is:

$$d(n)=-d(n+1)$$

then:

$$b(n)+b(n-2)+b(n-4)+b(n-6)=-[b(n+1)+b(n-1)+b(n-3)+b(n-5)],$$

or, equivalently:

$$b(n+1)+b(n)+b(n-1)+b(n-2)+b(n-3)+b(n-4)+b(n-5)+b(n-6)=0.$$

Thus, if the first and second values, as defined above, are equal, the sum of the eight consecutive bits is zero, and thus the eight consecutive bits contain equal numbers of +1s and −1s.

The next calculated first value is the sum d(n+2), calculated as the sum of the four most recent odd-numbered bits two sample periods after the calculation of d(n), and this is given by:

$$d(n+2)=b(n+2)+b(n)+b(n-2)+b(n-4).$$

If the new first and second values are equal, that is:

$$d(n+2)=-d(n+1)$$

then:

$$b(n+2)+b(n)+b(n-2)+b(n-4)=-[b(n+1)+b(n-1)+b(n-3)+b(n-5)],$$

or, equivalently:

$$b(n+2)+b(n+1)+b(n)+b(n-1)+b(n-2)+b(n-3)+b(n-4)+b(n-5)=0.$$

Thus, if the new first and second values are equal, the sum of these eight consecutive bits is zero, and thus these eight consecutive bits contain equal numbers of +1s and −1s.

However, the situation where the original first and second values are equal and the new first and second values are also equal can only occur when:

$$b(n+2)=b(n-6).$$

That is, this situation only persists when each received bit is the same as the bit received eight sample periods previously, that is, when there is an 8-bit long repeating pattern in the input data stream.

Figure 2:
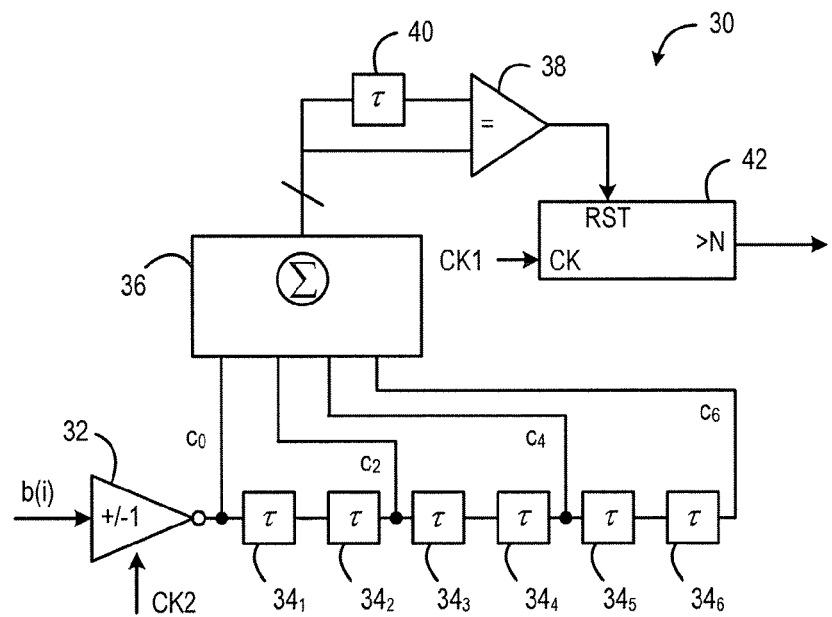
FIG. 2 is a block schematic diagram of a pattern detection circuit in the audio reproduction system of FIG. 1.

FIG. 2 illustrates a circuit for detecting the presence of a repetitive 8-bit silence pattern containing equal numbers of positive and negative bit values, by forming the first values and second values, determining whether successive first and second values are equal, and then determining whether this situation persists for long enough to decide that a repetitive 8-bit silence pattern is present. It will be apparent that, with suitable amendment, a similar circuit could test for the presence of a pattern of any predetermined even length containing equal numbers of positive and negative bit values.

Incidentally, although the preceding analysis referred to the positive and negative bit values as +1 and −1, signal levels of 1 and 0 would be used to represent these levels in practical digital circuits of the type described herein, allowing each bit value to be represented by a single digital bit. The analysis given above is still valid, except that a silence pattern is a pattern containing equal numbers of 1s and 0s, and therefore having a sum that is equal to half the length of the pattern (rather than zero), and the "inversion" operation is a logical inversion, by which a logical "1" becomes a logical "0" and vice versa.

In the pattern detection circuitry 30, the 1-bit data stream generated by the signal reproduction device 12 and containing successive bit values b(i) each expressed as 1 or 0, is applied to a controllable inverter 32. The operation of the inverter is controlled by a clock signal CK2 operating at half the bit rate, such that only alternate sample values are inverted.

Each sample output from the inverter 32, whether inverted or not, is fed into a delay line, containing six delay units $34_1$, $34_2$, $34_3$, $34_4$, $34_5$, $34_6$, each of which delays its input by one sample period τ.

During each sample period, the sample $c_0$ at the input to the delay line and the samples $c_2$, $c_4$, $c_6$ at the outputs of alternate stages of the delay line are applied to the inputs of an adder 36.

The resulting sum is applied to a first input of a comparator 38, and to a delay unit 40, which delays its input by one sample period t, and whose output is applied to a second input of the comparator 38.

Thus, during alternate sample periods, the adder 36 forms a first value, that is, the sum of the non-inverted input samples b(n), b(n−2), b(n−4) and b(n−6).

During the other alternate sample periods, the adder forms a second value, that is, the sum of the logically inverted input samples b(n+1), b(n−1), b(n−3) and b(n−5).

During each sample period, the comparator 38 then tests whether the first value generated in the preceding sample period is equal to the second value generated in the current sample period, or alternatively whether the second value generated in the preceding sample period is equal to the first value generated in the current sample period.

A count detector 42 receives a clock signal CK1, at the bit rate, at its input, and counts the number of received clock pulses. The count detector 42 generates an output signal when this counted number reaches a prescribed threshold value, N, and then maintains this output signal. The count detector 42 is reset when the output of the comparator 38 goes low. Thus, the count detector 42 generates an output signal when the equality of the first and second values has persisted for a length of time that is sufficient to determine that the input data stream contains a repetitive 8-bit pattern, but resets the output signal when the first and second values become unequal.

Figure 3:
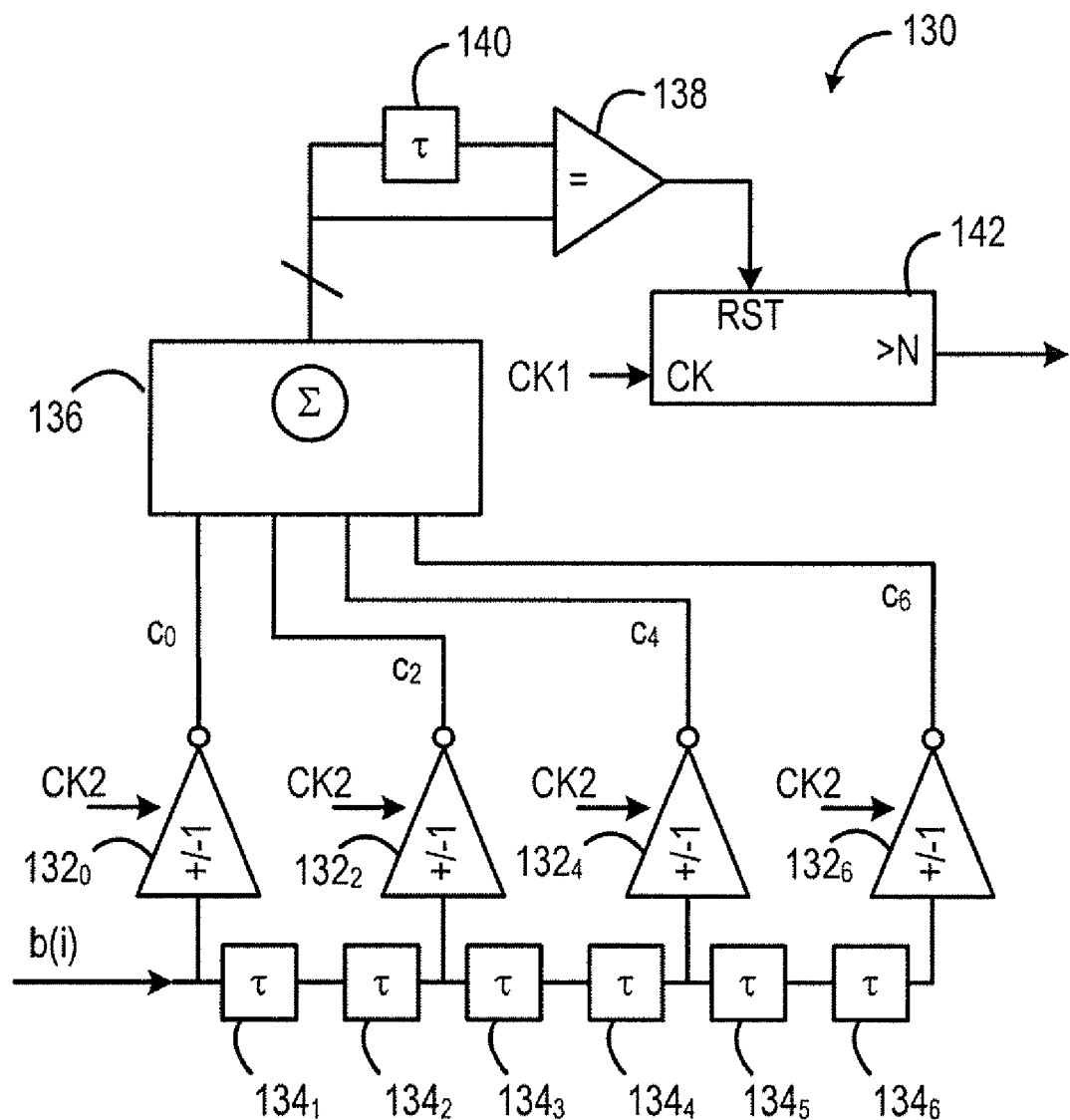
FIG. 3 is a block schematic diagram of an alternative pattern detection circuit in the audio reproduction system of FIG. 1.

FIG. 3 illustrates an alternative circuit for detecting the presence of a repetitive 8-bit silence pattern containing equal numbers of positive and negative bit values. In the pattern detection circuitry 130 shown in FIG. 3, the 1-bit data stream generated by the signal reproduction device 12 and containing successive bit values b(i) each expressed as 1 or 0, is fed into a delay line, containing six delay units $134_1$, $134_2$, $134_3$, $134_4$, $134_5$, $134_6$, each of which delays its input by one sample period τ.

The current input sample and the outputs of alternate stages of the delay line are applied to respective controllable logic inverters $132_0$, $132_2$, $132_4$, $132_6$. These inverters are controlled by a common clock signal CK2 operating at half the bit rate, such that they only invert their input signals during alternate sample periods.

The samples output from the inverters $132_0$, $132_2$, $132_4$, $132_6$, whether inverted or not, are then supplied to the inputs of an adder 136.

The resulting sum is applied to a first input of a comparator 138, and to a delay unit 140, which delays its input by one sample period τ, and whose output is applied to a second input of the comparator 138.

Thus, during alternate sample periods, the adder 136 forms a first value, that is, the sum of the non-inverted input samples b(n), b(n−2), b(n−4) and b(n−6).

During the other alternate sample periods, the adder forms a second value, that is, the sum of the inverted input samples b(n+1), b(n−1), b(n−3) and b(n−5).

During each sample period, the comparator 138 then tests whether the first value generated in the preceding sample period is equal to the second value generated in the current sample period, or alternatively whether the second value generated in the preceding sample period is equal to the first value generated in the current sample period.

As in FIG. 2, a count detector 142 receives a clock signal CK1, at the bit rate, at its input, and counts the number of received clock pulses. The count detector 142 generates an output signal when this counted number reaches a prescribed threshold value, N, and then maintains this output signal. The count detector 142 is reset when the output of the comparator 138 goes low. Thus, the count detector 142 generates an output signal when the equality of the first and second values has persisted for a length of time that is sufficient to determine that the input data stream contains a repetitive 8-bit pattern, but resets the output signal when the first and second values become unequal.

Figure 4:
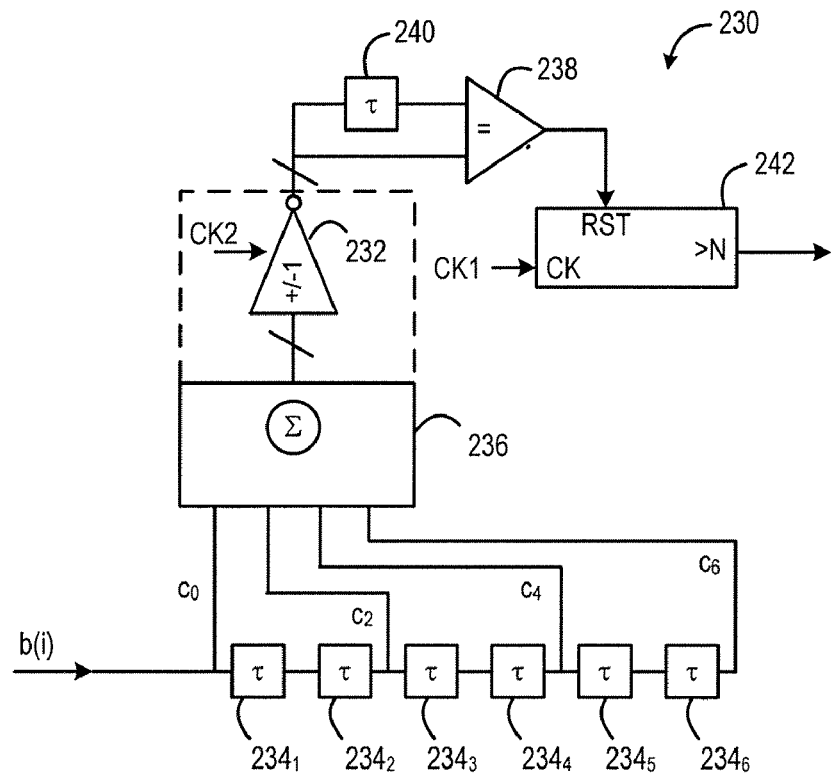
FIG. 4 is a block schematic diagram of a further alternative pattern detection circuit in the audio reproduction system of FIG. 1.

FIG. 4 illustrates a further alternative circuit for detecting the presence of a repetitive 8-bit silence pattern containing equal numbers of positive and negative bit values. In the pattern detection circuitry 230 shown in FIG. 4, the 1-bit data stream generated by the signal reproduction device 12 and containing successive bit values b(i), each expressed as +1 or −1, is fed into a delay line, containing six delay units $234_1$, $234_2$, $234_3$, $234_4$, $234_5$, $234_6$, each of which delays its input by one sample period τ.

The current input sample and the outputs of alternate stages of the delay line are applied to the inputs of an adder 236.

The resulting sum is applied to a controllable logic inverter 232. The operation of the inverter is controlled by a clock signal CK2 operating at half the bit rate, such that only alternate sample values are inverted.

Each output value from the inverter 232, whether inverted or not, is applied to a first input of a comparator 238, and to a delay unit 240, which delays its input by one sample period τ, and whose output is applied to a second input of the comparator 238.

Thus, during alternate sample periods, the adder 236 and inverter 232 form a first value, that is, the sum of the non-inverted input samples b(n), b(n−2), b(n−4) and b(n−6).

During the other alternate sample periods, the adder 236 and inverter 232 form a second value, that is, the inverted sum of the input samples b(n+1), b(n−1), b(n−3) and b(n−5).

During each sample period, the comparator 238 then tests whether the first value generated in the preceding sample period is equal to the second value generated in the current sample period, or alternatively whether the second value generated in the preceding sample period is equal to the first value generated in the current sample period.

As before, a count detector 242 receives a clock signal CK1, at the bit rate, at its input, and counts the number of received clock pulses. The count detector 242 generates an output signal when this counted number reaches a prescribed threshold value, N, and then maintains this output signal. The count detector 242 is reset when the output of the comparator 238 goes low. Thus, the count detector 242 generates an output signal when the equality of the first and second values has persisted for a length of time that is sufficient to determine that the input data stream contains a repetitive 8-bit pattern, but resets the output signal when the first and second values become unequal.

Figure 5:
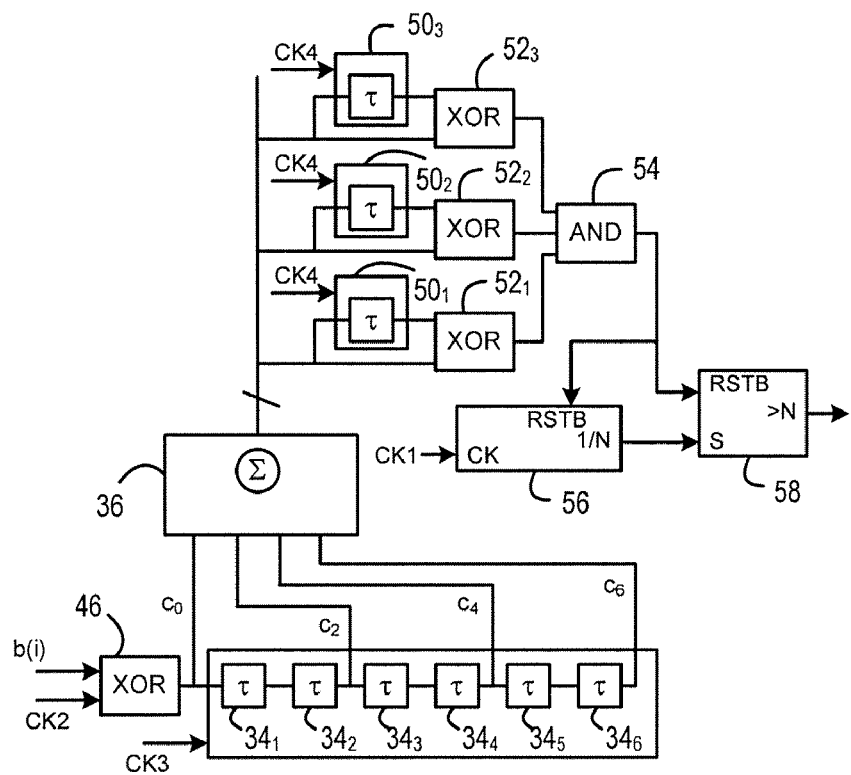
FIG. 5 is a block schematic diagram of a further alternative pattern detection circuit in the audio reproduction system of FIG. 1.

FIG. 5 is a further block diagram, showing in more detail the pattern detection circuitry 30 of FIG. 2 in such a practical digital implementation.

Specifically, the inverter 32 is shown as taking the form of an XOR logic gate 46, receiving the input bits b(i) on a first input and the clock signal CK2 at half the bit rate on a second input.

The delay units $34_1$, $34_2$, $34_3$, $34_4$, $34_5$, $34_6$ are shown forming a shift register 48, which is clocked by a clock signal CK3 at the bit rate, although it may be clocked at half the bit rate, depending on the implementation of the shift register. It will also be noted that, since it is only the output of every alternate shift register element that is tapped, the shift register stages can be non-inverting or can alternatively all be inverting, without having any effect on the operation of the device. This may allow the use of a shift register that is smaller and/or cheaper and/or has lower power consumption.

The output from 36 may represent 0, 1, 2, 3, or 4 binary "ones" from c0, c2, c4, and c6. This may be represented in turn by a binary number of three digits or bits. If equality is maintained, each bit must stay constant during each clock cycle. Thus, each of these three bits is delayed by one clock cycle by a respective single shift register element $50_1$-$50_3$, and each of these shift register elements is clocked by a clock signal CK4 at the bit rate, although it may be clocked at half the bit rate, depending on the implementation.

Each delayed bit is then compared to a respective non-delayed bit by a respective comparator, implemented here in the form of an XOR gate $52_1$-$52_3$. The outputs of the XOR gates $52_1$-$52_3$ are input to an AND gate 54 to check that every one of the three XOR gates $52_1$-$52_3$ is indicating bit-wise equality.

In the absence of a suitable silence pattern, the AND gate output will be low. This output is presented to the RSTB inputs of a counter 56 and a flip-flop 58 to hold their respective outputs low. When the equality condition is detected, these RSTB inputs go high, allowing the counter 56 to start counting up from zero, though the overall output will still be low. The counter is clocked at the bit rate by clock CK1 such that, if the equality is maintained for a predetermined number N of clock cycles, the counter will deliver an output signal. Typically N is chosen as a power of 2 (at least 8, but typically a lot greater to minimise the small chance of false triggering during a near-silent piece of music), and the output will be the MSB of the counter. As the counting continues, this MSB may roll over back to 0. However the counter output is fed to the S input of the flip-flop 58, whose output will only return to zero when reset by the output of the AND gate 54, i.e. when equality is no longer detected.

Note that the output of 36 need not be a normal binary representation of the count: it can be any mapping provided it gives a unique output code for each number of input ones applied. For instance it could be a 5-bit thermometer code or a Gray code. Its output could also be output as a serial bit stream rather than parallel with appropriate modification of the downstream circuitry.

It will be apparent that, just as FIG. 5 gives details about the implementation of the embodiment shown in FIG. 2, aspects of the embodiments shown in FIGS. 3 and 4 can be implemented in similar ways.

Figure 6:
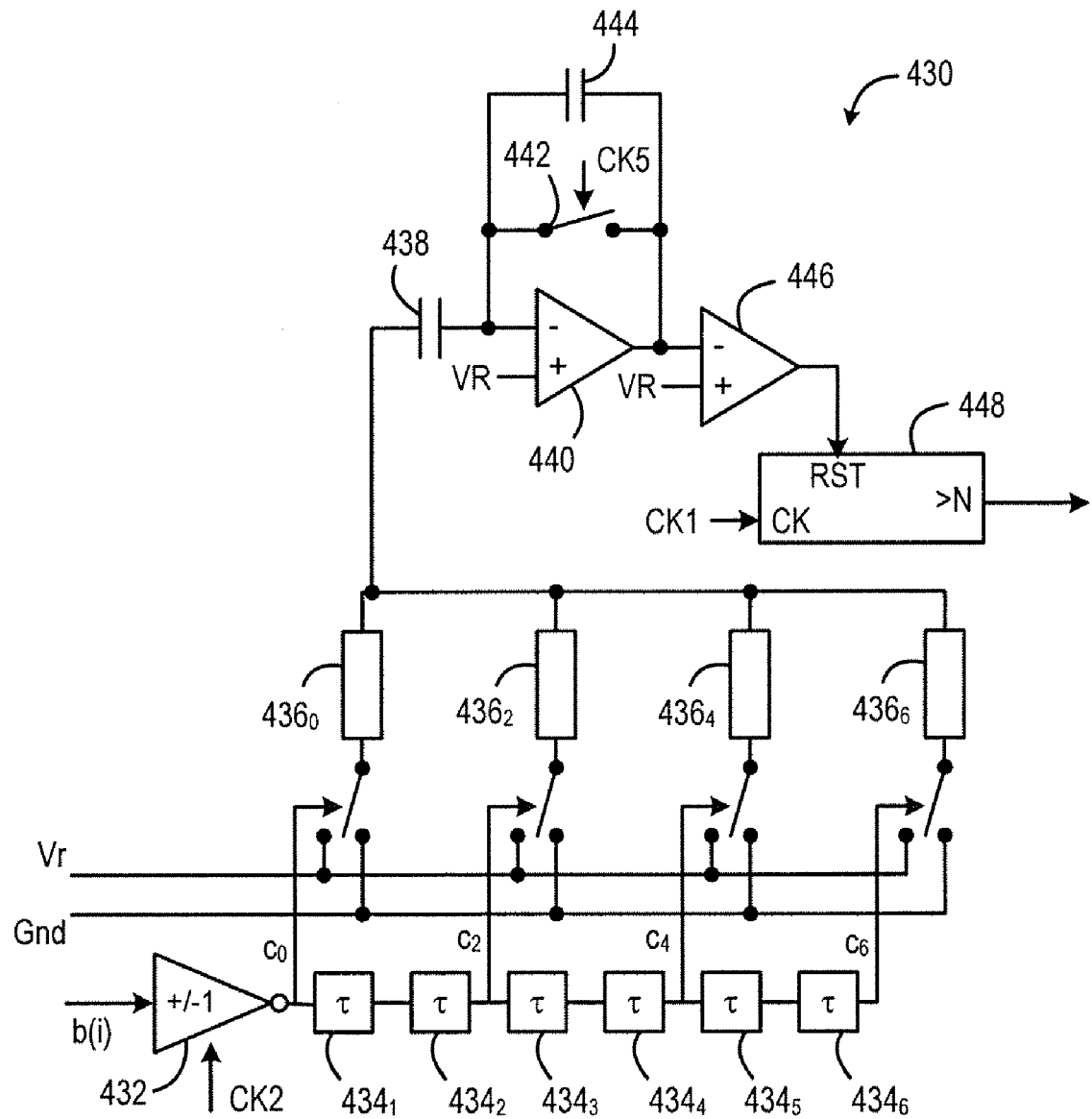
FIG. 6 is a block schematic diagram of a further alternative pattern detection circuit in the audio reproduction system of FIG. 1.

The invention has been described so far with reference to embodiments in which the pattern detection circuitry is implemented in digital circuitry. However, at least partly analogue circuit embodiments are also possible, and FIG. 6 shows an embodiment of a mixed-signal pattern detection circuit 430.

As described with reference to FIG. 2, the input digital bit stream b(i) is applied to an inverter 432, operating under the control of a clock signal CK2, typically at half the bit rate, such that received bits are inverted during alternate sample periods. The inverter output bits are passed down a shift register 434, made up of delay elements $434_1$, $434_2$, $434_3$, $434_4$, $434_5$, $434_6$.

During each time period, the current sample value $c_0$ and the alternate tap values $c_2$, $c_4$, $c_6$ are used to control the voltage applied to one end of a respective resistor $436_0$, $436_2$, $436_4$, $436_6$, connecting it to ground (Gnd) if the tapped bit is a zero, or to a supply, bias, or reference voltage Vr if the tapped bit is a one.

The other ends of the resistors $436_0$, $436_2$, $436_4$, $436_6$, are connected together to provide the output of this resistor network. If all the tapped bits are zero, all resistors will be pulled low, and the output of the resistor network will be ground. If all the tapped bits are one, all resistors will be pulled high to the supply, and the output of the resistor network will be equal to that of the supply. If half the tapped bits are zero and the other half are ones, then the output voltage will be mid-way. Thus the resistor network acts as a simple digital-to-analogue converter.

This analogue output voltage is fed via a capacitor 438 into the inverting input of an amplifier 440. During the second half of each clock cycle, a clock CK5 closes a switch 442, and the amplifier output becomes equal to the bias voltage VR applied to the amplifier non-inverting input, typically mid-rail for a single-supply system. The switch 442 is released at the end of the clock cycle, and at the start of the next clock cycle the analogue output voltage from the resistor network applied to the capacitor 438 changes to the value associated with the next sum value. If the sum value has changed from the previous cycle, the amplifier output will swing away from VR. If the sum value is unchanged, then the amplifier output will stay at VR.

In practice, even if the input bit stream is correct, there will be a small deviation in the analogue signal from cycle to cycle. Also, the amplifier itself will have some offset voltage, so an additional capacitor 444 is connected from the output to the inverting input of the amplifier 440 to apply some negative feedback to reduce the amplifier output signal swing. The capacitor 444 may have a similar capacitance to that of the input capacitor 438, in which case the closed-loop voltage gain will be approximately unity, but the capacitor values may be adjusted to optimise the gain.

The amplifier output signal is fed into a window comparator 446, which will output a logic high level when its input signal falls into a window around VR. This window is chosen large enough to still trigger in the presence of anticipated circuit offsets and mismatches and noise, but small enough not to trigger in the presence of an "LSB" of input signal even in conjunction with anticipated offsets and mismatches and noise.

As before, the comparator output is applied to the reset of a count detector 448 that receives pulses from a clock CK1, typically at the bit rate, and provides an output signal when the counted value exceeds a threshold value.

Figure 7:
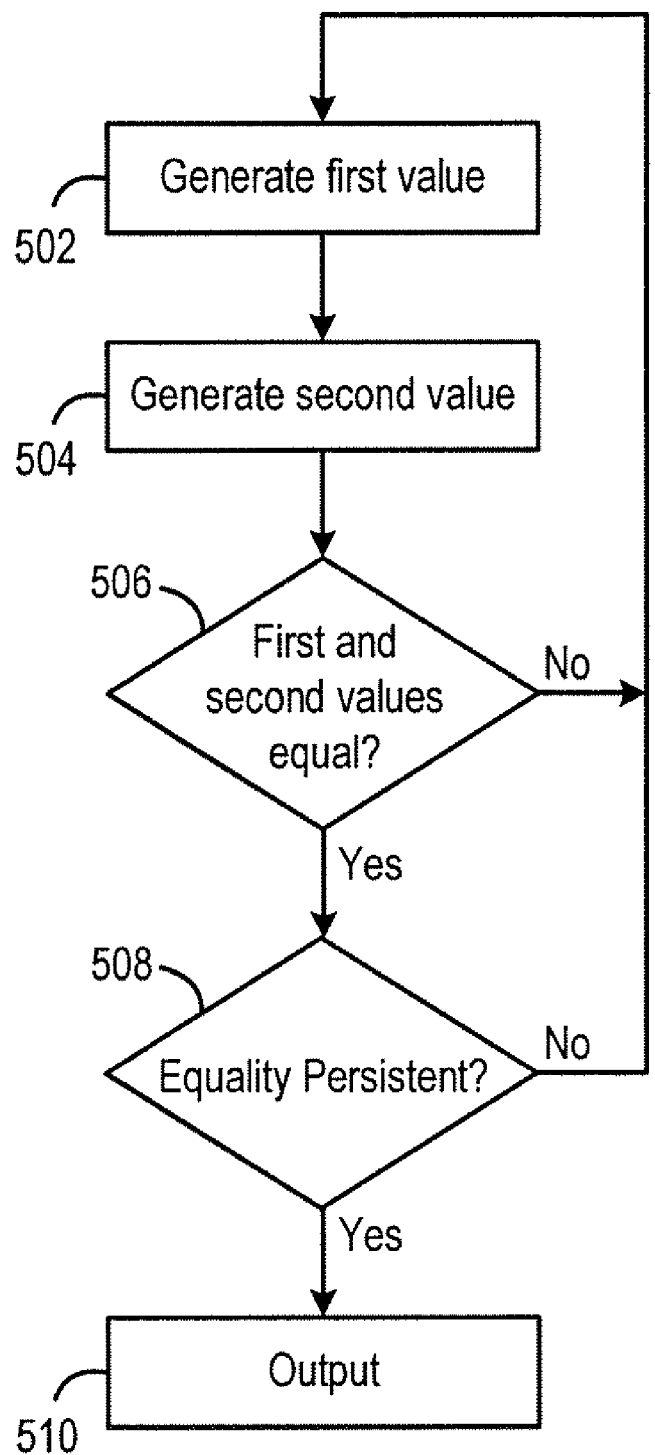
FIG. 7 is a flow chart, illustrating a method of operation of the audio reproduction system, in accordance with an aspect of the present invention.

FIG. 7 is a flow chart, illustrating a method of pattern detection, using a pattern detection device as described above.

In step 502 of the process, a first value is formed during a first sample period. For the purposes of explanation, the first sample period is defined as one in which the controllable inverter of the pattern detection device is controlled so that it is not operating to invert the relevant bits.

In step 504, a second value is formed during a second sample period, as the inverse of the sum of the relevant bits. As discussed above, this can for example be formed by inverting the bits at the input of the pattern detection device, inverting the sampled bits, and forming the inverse of the sum of the relevant bits.

In step 506, this second value is compared with the first value formed during the preceding sample period, to test for equality.

If the first and second values are equal, it is tested in step 508 whether this equality persists. If so, an output signal is generated in step 510.

The process continues in each sample period, with the first and second values being calculated in alternate sample periods, and the most recent first sample value being compared with the most recent second sample value at each stage.

The system as described so far allows for the detection of a silence pattern, that is, any repeated 8-bit sequence, containing equal numbers of 1s and 0s.

However, it is also possible for the pattern detection circuit to distinguish between different silence patterns in a straightforward way.

As discussed above, every 8-bit silence pattern contains equal numbers of 1s and 0s, i.e. it contains four 1s and four 0s. Although, in every case, the calculated first and second values will remain constant during successive sample periods, the numerical values of these first and second values will depend on the numbers of 1s and 0s in the odd- and even-numbered positions of the 8-bit pattern, and the phasing of the pattern relative to the clock controlling the inverter or inverters.

Thus, in the case where the silence pattern has 1s in the four odd-numbered positions and 0s in the four even-numbered positions (i.e. the silence pattern is 1 0 1 0 1 0 1 0), the first and second values will both be 0 (if it is the odd-numbered bit values that are inverted) or 4 (if it is the even-numbered bit values that are inverted). Since this relative phasing cannot be controlled, values of 4 and 0 have to be taken as equivalent for these purposes. Similarly, where the silence pattern has 1 s in the four even-numbered positions and 0s in the four odd-numbered positions (i.e. the silence pattern is 0 1 0 1 0 1 0 1), the first and second values will both be 0 (if it is the even-numbered bit values that are inverted) or 4 (if it is the odd-numbered bit values that are inverted).

Where the silence pattern has 1s in three of the four odd-numbered positions and 0s in three of the four even-numbered positions, or vice versa, (e.g. the silence pattern is 1 0 1 0 1 0 0 1 or 0 1 0 1 0 1 1 0), the first and second values will both be 3 or 1, depending on the phasing. Since this relative phasing cannot be controlled, values of 3 and 1 have to be taken as equivalent for these purposes.

Where the silence pattern has both 1s and 0s in two of the four odd-numbered positions and two of the four even-numbered positions, (e.g. the silence pattern is 1 0 1 0 0 1 0 1 or 0 1 0 1 1 0 1 0), the first and second values will both be 2.

It can therefore be seen that the exact form of the silence pattern can be used to code information for use by the pattern detector and subsequent control of the system. For example, a first form of silence pattern could be used to indicate inter-track silence, a second form of silence pattern could be used to indicate end-of-disc silence, and/or a third form of silence pattern could be used to indicate that the signal reproduction device has been idle for a predetermined time (such as five minutes, say), and hence that the system could enter one of various available standby modes to conserve power.

The silence pattern could be altered from that present on original recorded media by the signal reproduction device. Thus some signalling information can be transmitted on the audio data channel during periods of silence without needing a parallel signalling channel. This is especially useful for example where the link between the signal reproduction device and the following circuitry is a wireless link. One or more of the silence patterns could thus also be used to provide encoded information about any other aspect of the operation of the system.

For example, in the case of a wireless system, where information is transmitted from the playback device over a wireless link to a separate receiver device including at least the loudspeaker, a displacement or movement sensor can be associated with the playback device, and a detection of movement can be used to signal to the receiver device that, for example, the receiver sensitivity needs to be increased to deal with the movement of the transmitter.

It would be possible to use this signalling system during non-silent periods if the source device just interrupted the music and sent "silence" for a while. For example, if the CD player also functioned as a telephone receiver, an incoming call could trigger a "silence" to be transmitted across the link with appropriate code to distinguish it from "normal" silence. This would perhaps allow the second, remote, unit to reconfigure itself as a cordless phone unit with a duplex wireless link.

In general though, for "invisible" operation for non-interrupt scenarios, the first unit would also need a silence detector in order to know when to replace the original silence pattern with a modified one.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

There is therefore disclosed a pattern detector, and a corresponding detection method, that can be used for detecting repeated patterns of known length, where the repeated pattern contains equal numbers of the two possible logic values.

It is noted that the invention may be used in a number of applications. These include, but are not limited to, consumer applications and automotive applications. For example, typical consumer applications include laptops, mobile phones, PDAs and personal computers. Typical automotive applications include in-car, in-train and in-plane entertainment systems.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

What is claimed is:

1. A pattern detection circuit, for detecting a pattern in a received bit stream, comprising:
    summing circuitry,
    for forming during first alternate time periods a sum of a first sequence comprising a predetermined number of alternate bits in said bit stream; and
    for forming during second alternate time periods an inverse of a sum of a second sequence comprising said predetermined number of alternate bits in said bit stream, the second alternate time periods being interleaved with the first alternate time periods, and the second sequence of alternate bits being interleaved with the first sequence of alternate bits; and
    comparison circuitry, for determining whether successive sums formed by the summing circuitry are equal.

2. A pattern detection circuit as claimed in claim 1, further comprising:
    a delay line, for receiving each bit in said bit stream, and comprising a plurality of delay elements each for delaying each received bit by one sample period; and
    an adder, connected to said delay line, for forming a sum of a current bit from said bit stream and a plurality of bits received an even number of sample periods previously.

3. A pattern detection circuit as claimed in claim 2, comprising:
    an inverter, connected to receive said bit stream, and to invert alternate bits before passing them to said delay line.

4. A pattern detection circuit as claimed in claim 2, comprising:
a plurality of inverters, connected to receive from said delay line said current bit from said bit stream and said plurality of bits received an even number of sample periods previously, and to invert its received bits during alternate sample periods before passing them to said adder.

5. A pattern detection circuit as claimed in claim 2, comprising:
an inverter, connected to receive an output from said adder, and to invert alternate received values before passing them to said comparison circuitry.

6. A pattern detection circuit as claimed in claim 1, wherein said comparison circuitry is adapted to generate an output signal when successive sums formed by the summing circuitry are equal for a predetermined number of sample periods.

7. A pattern detection circuit as claimed in claim 6, comprising:
a counter, for receiving clock pulses at a frequency determined by the sample period, and forming a count of received clock pulses, and being reset when said comparison circuitry does not generate an output signal, said counter being adapted to generate an output signal when said count value exceeds a threshold value.

8. An audio reproduction system, comprising:
a pattern detection circuit as claimed in claim 1, adapted for detecting a silence pattern in a received bit stream of audio data; and
means for controlling said system in response to a detection of a silence pattern.

9. An audio reproduction system as claimed in claim 8, comprising:
a playback device, associated with said pattern detection circuit in a first device; and
a second device comprising at least a loudspeaker,
wherein the first device is able to transmit data to the second device over a wireless link, and
wherein the pattern detection circuit is adapted to control the second device in response to detection of a silence pattern.

10. An audio reproduction system as claimed in claim 8, wherein the pattern detection circuit is adapted for distinguishing between different silence patterns detected in the received bit stream of audio data.

11. An audio reproduction system as claimed in claim 9, wherein the second device further comprises an amplifier, for supplying an amplified audio signal to the loudspeaker,
wherein the pattern detection circuit is located in the second device, and
wherein the pattern detection circuit is adapted to mute the loudspeaker in response to detection of a silence pattern.

12. An audio reproduction system as claimed in claim 9, wherein the first device is adapted to insert a predetermined silence pattern into an audio data stream.

13. An audio reproduction system as claimed in claim 12, wherein the first device is adapted to detect a silence pattern in an audio data stream received from the playback device, and to modify said silence pattern in data transmitted to the second device.

14. A method of detecting repetitive pattern in a received bit stream, the method comprising:
forming during first alternate time periods a sum of a first sequence comprising a predetermined number of alternate bits in said bit stream; and
forming during second alternate time periods an inverse of a sum of a second sequence comprising said predetermined number of alternate bits in said bit stream, the second alternate time periods being interleaved with the first alternate time periods, and the second sequence of alternate bits being interleaved with the first sequence of alternate bits; and
determining whether the sum of the first sequence and the inverse of the sum of the second sequence sums are equal during a plurality of successive sample periods.

15. A method as claimed in claim 14, further comprising:
receiving each bit in said bit stream;
delaying each received bit by one sample period; and
forming a sum of a current bit from said bit stream and a plurality of bits received an even number of sample periods previously.

16. A method as claimed in claim 14, further comprising:
inverting alternate bits before the step of delaying the received bits.

17. A method as claimed in claim 14, further comprising:
inverting said plurality of bits received an even number of sample periods previously before the step of forming said sum.

18. A method as claimed in claim 14, further comprising:
inverting said sum of the current bit from said bit stream and the plurality of bits received an even number of sample periods previously.

19. A method as claimed in claim 14, further comprising:
generating an output signal when successive sums are equal for a predetermined number of sample periods.

20. A method as claimed in claim 19, further comprising:
receiving clock pulses at a frequency determined by the sample period;
forming a count of received clock pulses, said count being reset when successive sums are not equal; and
generating an output signal when said count value exceeds a threshold value.

21. A method as claimed in claim 14, further comprising:
controlling an audio reproduction system in response to a detection of a silence pattern.

22. A method as claimed in claim 14, further comprising:
distinguishing between different silence patterns detected in the received bit stream of audio data.

23. A method as claimed in claim 21, further comprising:
muting a loudspeaker of said audio reproduction system in response to detection of a silence pattern.

24. A method as claimed in claim 21, further comprising:
inserting a predetermined silence pattern into an audio data stream.

25. A method as claimed in claim 23, further comprising:
detecting a silence pattern in an audio data stream received from the playback device, and
modifying said silence pattern.

26. An electronic device comprising an audio reproduction system as claimed in claim 8.

27. A communications device comprising an audio reproduction system as claimed in claim 8.

28. A computer device comprising an audio reproduction system as claimed in claim 8.

29. A vehicle entertainment system, comprising an audio reproduction system as claimed in claim 8.

* * * * *